US006621287B2

(12) United States Patent
Abazarnia et al.

(10) Patent No.: US 6,621,287 B2
(45) Date of Patent: Sep. 16, 2003

(54) CONNECTOR ASSEMBLY WITH DECOUPLING CAPACITORS

(75) Inventors: Nader N. Abazarnia, Chandler, AZ (US); Jeffrey H. Luke, Gilbert, AZ (US); James Neeb, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 09/858,224

(22) Filed: May 15, 2001

(65) Prior Publication Data

US 2002/0171443 A1 Nov. 21, 2002

(51) Int. Cl.7 .............................................. G01R 31/26
(52) U.S. Cl. .................................... 324/765; 324/158.1
(58) Field of Search ........................... 333/1, 236, 237, 333/243, 244, 906; 174/24, 26 R, 27, 36, 103, 105 R, 106 R, 107, 108, 110 R, 113 R, 116, 117 F; 324/765, 158.1; 439/623

(56) References Cited

U.S. PATENT DOCUMENTS

| | | | | |
|---|---|---|---|---|
| 3,693,114 A | * | 9/1972 | Kempf | 333/101 |
| 4,493,951 A | * | 1/1985 | Sanderson et al. | 379/28 |
| 4,552,989 A | * | 11/1985 | Sass | 174/103 |

* cited by examiner

*Primary Examiner*—Kamand Cuneo
*Assistant Examiner*—Russell M. Kobert
(74) *Attorney, Agent, or Firm*—Schwegman, Lundberg, Woessner & Kluth, P.A.

(57) ABSTRACT

A connector assembly is disclosed and claimed. The connector assembly includes a connector and a cable attachable at one end to the connector. The cable includes a first conductive layer and a second conductive layer disposed over the first conductive layer. A layer of insulation material is disposed at least between the first conductive layer and the second conductive layer and a plurality of capacitors are connected between the first conductive layer and the second conductive layer.

18 Claims, 9 Drawing Sheets

CONNECTOR ASSEMBLY WITH DECOUPLING CAPACITORS

FIELD OF THE INVENTION

The present invention relates generally to integrated circuits, and more particularly to a connector with decoupling capacitors to connect an integrated circuit, such as a processor chip or the like, to a power supply.

BACKGROUND INFORMATION

Integrated circuits (ICs), such as processor chips for computer systems and the like, are continually being required to perform more functions or operations and to perform these operations at ever increasing speeds. As performance requirements have increased, so have the power requirements for these devices to operate properly and efficiently. Current and future high performance processors may require as much as 100 amperes of current or more. This presents challenges to designers of packaging for such ICs or chips and designers of test systems for testing and evaluating such high performance ICs to supply high current at relatively low voltages to power the ICs with little if any added resistance or inductance that would adversely affect the power requirements of the IC and with minimal noise interference that could adversely affect performance.

Accordingly, there is a need for a connector system for high power, high performance ICs that reduces voltage droop and settling time and decouples or reduces noise interference to the IC.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1A:
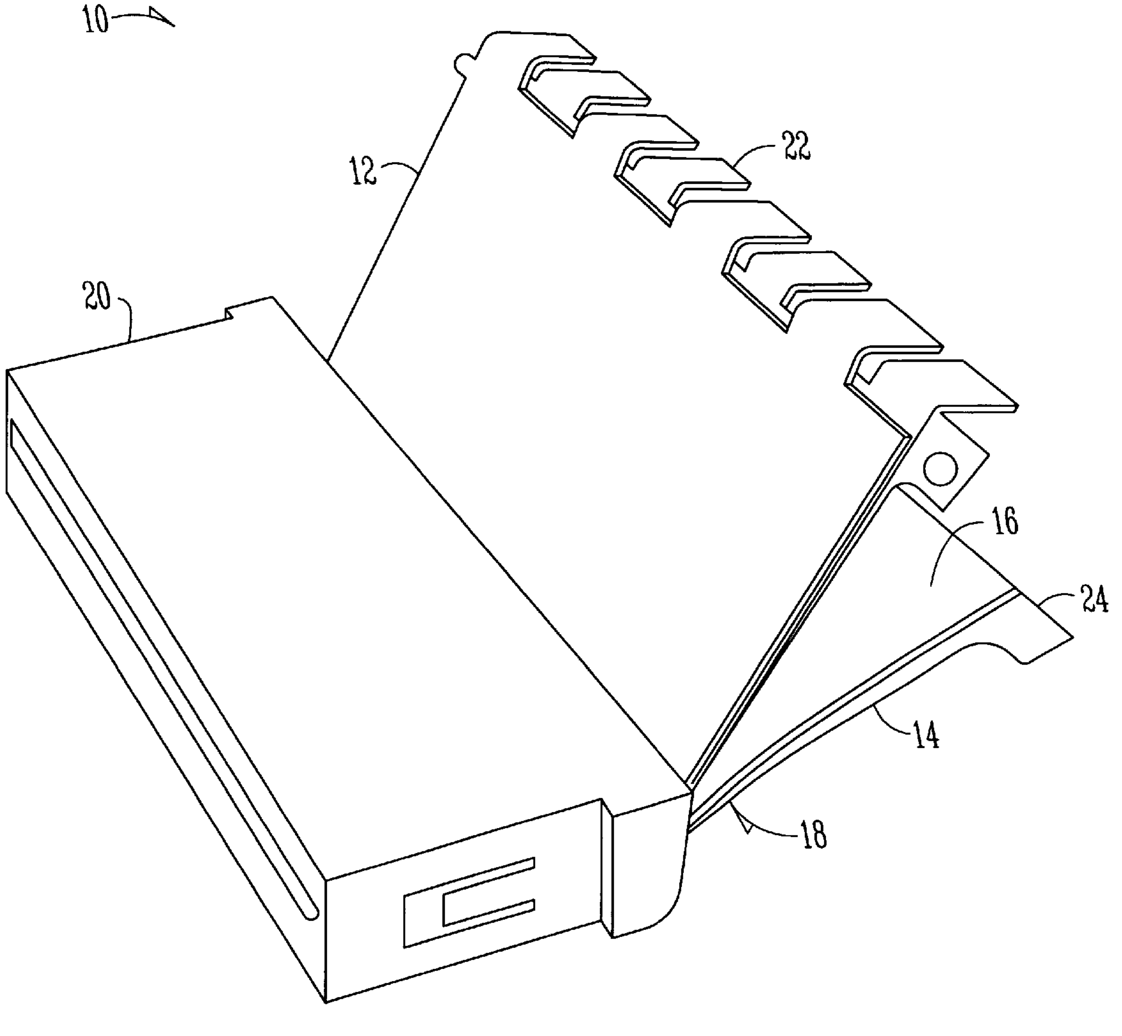
FIGS. 1A, 1B and 1C are progressive views illustrating the making of a connector assembly in accordance with the present invention

The connector assembly 10 of the present invention and method of making the connector assembly 10 will be described with reference to FIGS. 1A, 1B and 1C. A first layer 12 of conductive material and a second layer 14 of conductive material are provided or formed and are separated by a layer 16 of insulation material. The first and second layers 12 and 14 of conductive material may be substantially planar sheets of copper or other highly conductive material and are flexible at least for some applications. The layer 16 of insulation material may be a coating of mylar or the like that substantially completely covers each of the first and second conductive layers 12 and 14 and is pliable to move with the flexible conductive layers 12 and 14. The first layer 12 of conductive material is disposed over the second layer 14 of conductive material to define a two conductor flexible cable 18. One side edge or end (not shown in FIG. 1A) of the first conductive layer 12 is electrically connected to one terminal or set of terminals (not shown) of a power pod connector plug 20 and one side edge or end (not shown) of the second conductive layer 14 adjacent to the one side edge of the first conductive layer 12 is electrically connected to another terminal or set of terminals of the power pod connector plug 20. As described in more detail below, the connector plug 20 will connect to a mating connector or power tab of an IC or central processing unit (CPU).

A plurality of tabs 22 extending from the first conductive layer 12 will be used to connect the first conductive layer 12 to an external power source or bank of capacitors as will be described in more detail below and another plurality of tabs 24 extending from the second conductive layer 14 will also be used to connect the second conductive layer 14 to ground making the second conductive layer 14 a ground plane. The first and second conductive layers 12 and 14 are basically symmetrical and the second conductive layer 14 could just as well be connected to the external power source or supply and the first conductive layer 12 to ground.

Figure 1B:
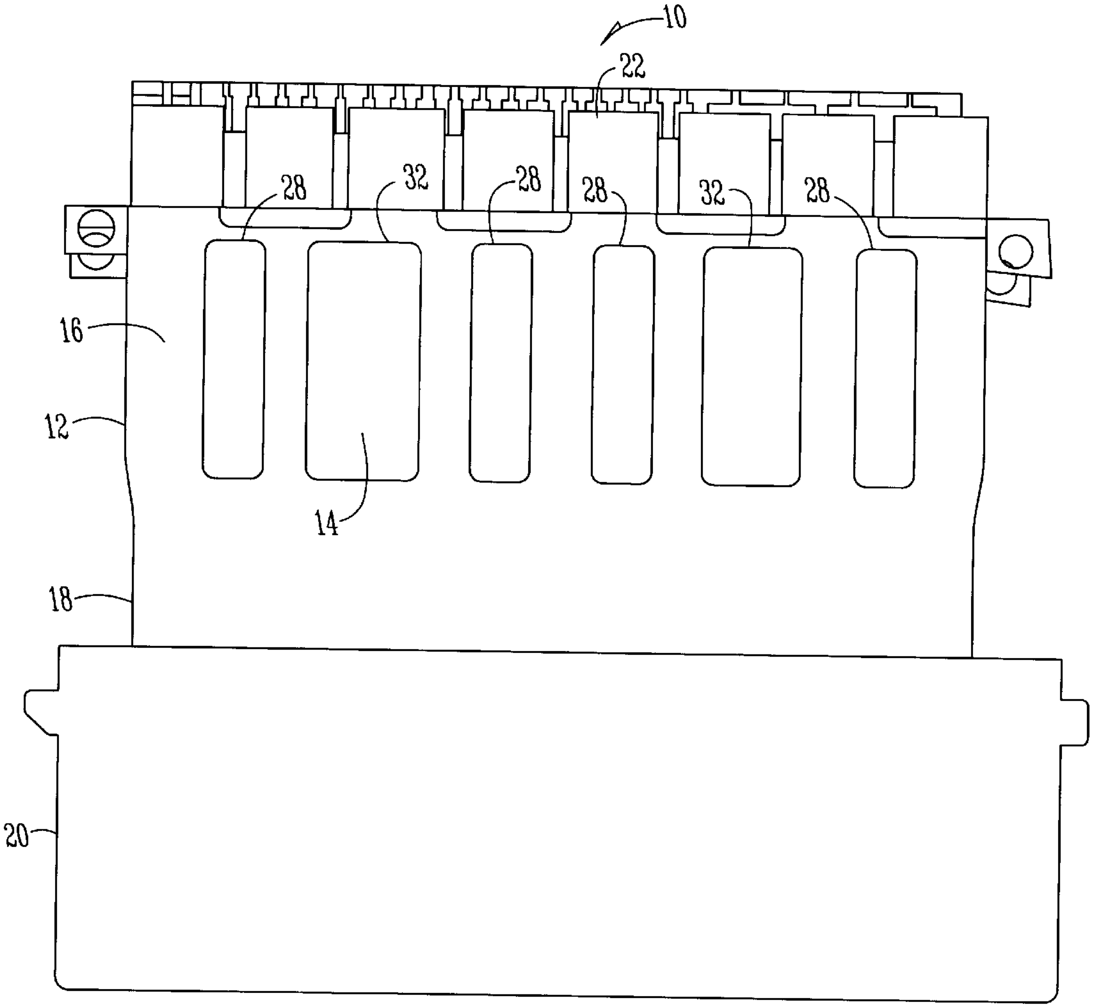
Figure 1C:
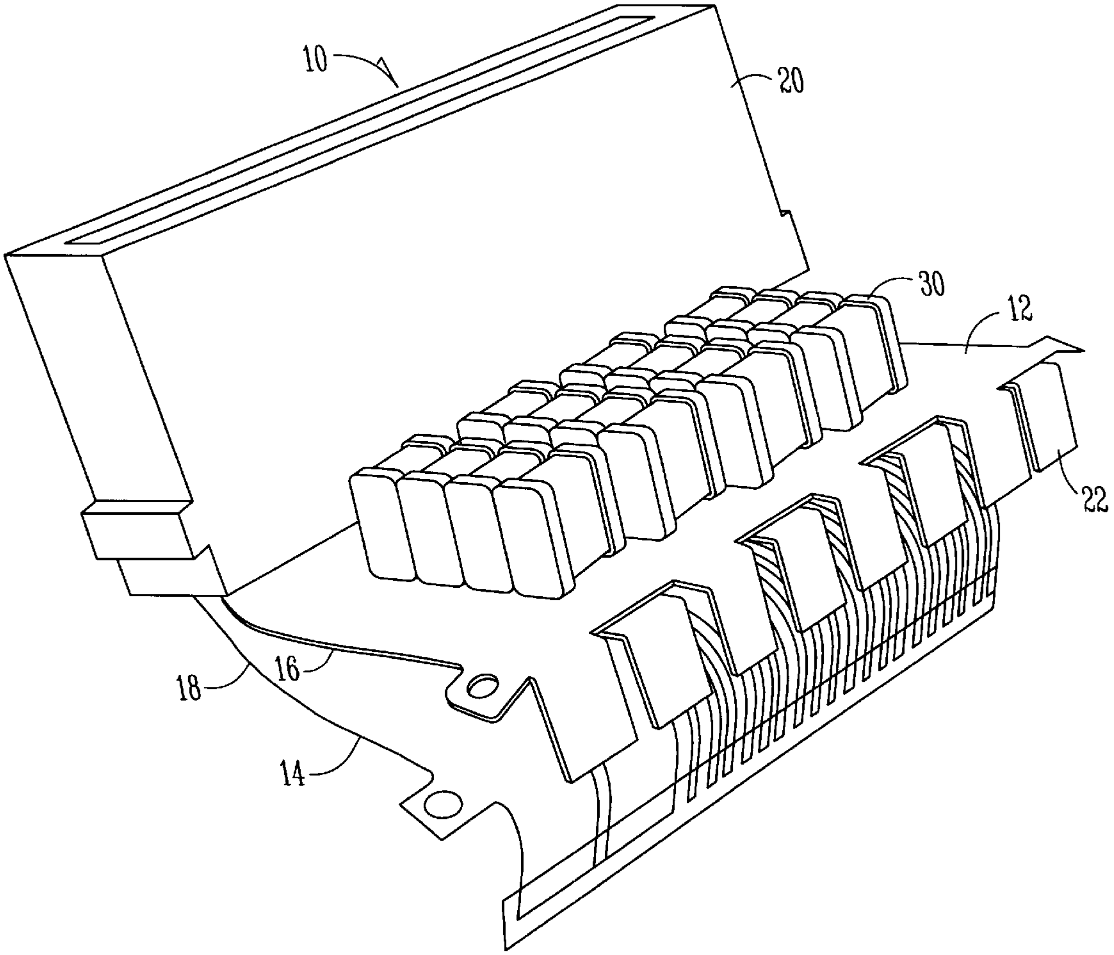

In FIG. 1B a portion of the insulation material layer 16 is removed from the first conductive layer 12 according to a first predetermined pattern to form narrow, elongated slots 28 exposing at least portions of the conductor of the first conductive layer 12 for connecting one side or terminal of each of a plurality of capacitors 30 (FIG. 1C) to the first conductive layer 12. The first conductive layer 12 is then formed or machined according to a second predetermined pattern to form wider, elongated openings 32 through the first conductive layer 12, and the insulation material layer 16 is removed from the second conductive layer 14 according to the second predetermined pattern to expose at least portions of the conductor of the second conductive layer 14 for connecting another side or terminal of each of the plurality of capacitors 30 to the second conductive layer 14. The capacitors 30 are connected in parallel between the first conductive layer 12 and the second conductive layer 14. The first and second predetermined patterns are selected to minimize the area on the conductive layers 12 and 14 needed to connect the number of capacitors 30 that are required to provide the level of noise decoupling and the reduction in equivalent series resistance (ESR) and voltage droop desired. The first and second predetermined patterns are also selected to minimize the amount of conductor material removed from the first conductive layer 12 so as to maintain the resistance of the cable 18 as low as possible to minimize voltage droop and to maximize the current carrying capacity of the cable 18. It should also be noted that other patterns could be used as well depending upon the spatial and operational requirements and need to keep the cable 18 resistance low.

In the example of Figure IC, sixteen chip capacitors 30 are electrically connected by soldering or the like in parallel between the first and second conductive layers 12 and 14 in a 4×4 matrix layout. For a high power, high performance processor, the sixteen capacitors 30 may each be a 1000 microfarad chip capacitors to provide the appropriate level of noise decoupling or reduction for the high current being supplied. Multiple capacitors 30 are connected in parallel rather than a single larger capacitor or a smaller number of larger capacitors to reduce the ESR inherent in the capacitors 30. Because the equivalent resistance of multiple resistors combined in parallel is lower than each of the individual resistances, the ESR of the multiple capacitors 30 in parallel will be much lower than the individual capacitors 30 thus presenting a lower series resistance to minimize the voltage droop. Accordingly, the quantity of the plurality of capacitors 30 and the size of each of the plurality of capacitors 30 are selected to provide a predetermined reduction in the ESR of the connector assembly 10 and corresponding reduction in voltage droop depending upon the requirements of the IC or CPU being supplied.

The capacitors 30 are also preferably connected between the first and second conductive layers 12 and 14 at a location proximate to the connector 20 so that the capacitors 30 are as close as possible to an IC or (CPU) when the connector 20 is connected to supply power to the IC or CPU. This provides for decoupling as close as possible to the CPU to minimize resistance in the flex cable 18 between the capacitors 30 and the CPU to reduce voltage droop and minimize the possibility of any induced noise on the cable 18.

Use of the connector assembly 10 with an IC or CPU and system for testing such ICs or CPUs will now be described. Such a system is also described in U.S. patent application Ser. No. 09/858,223, filed May 15, 2001, entitled "Floating and Self-Aligning Suspension System to Automatically Align and Attach a Connector to an Assembly" by Nader Abazarnia et al. which is assigned to the same assignee as the present invention.

Figure 2:
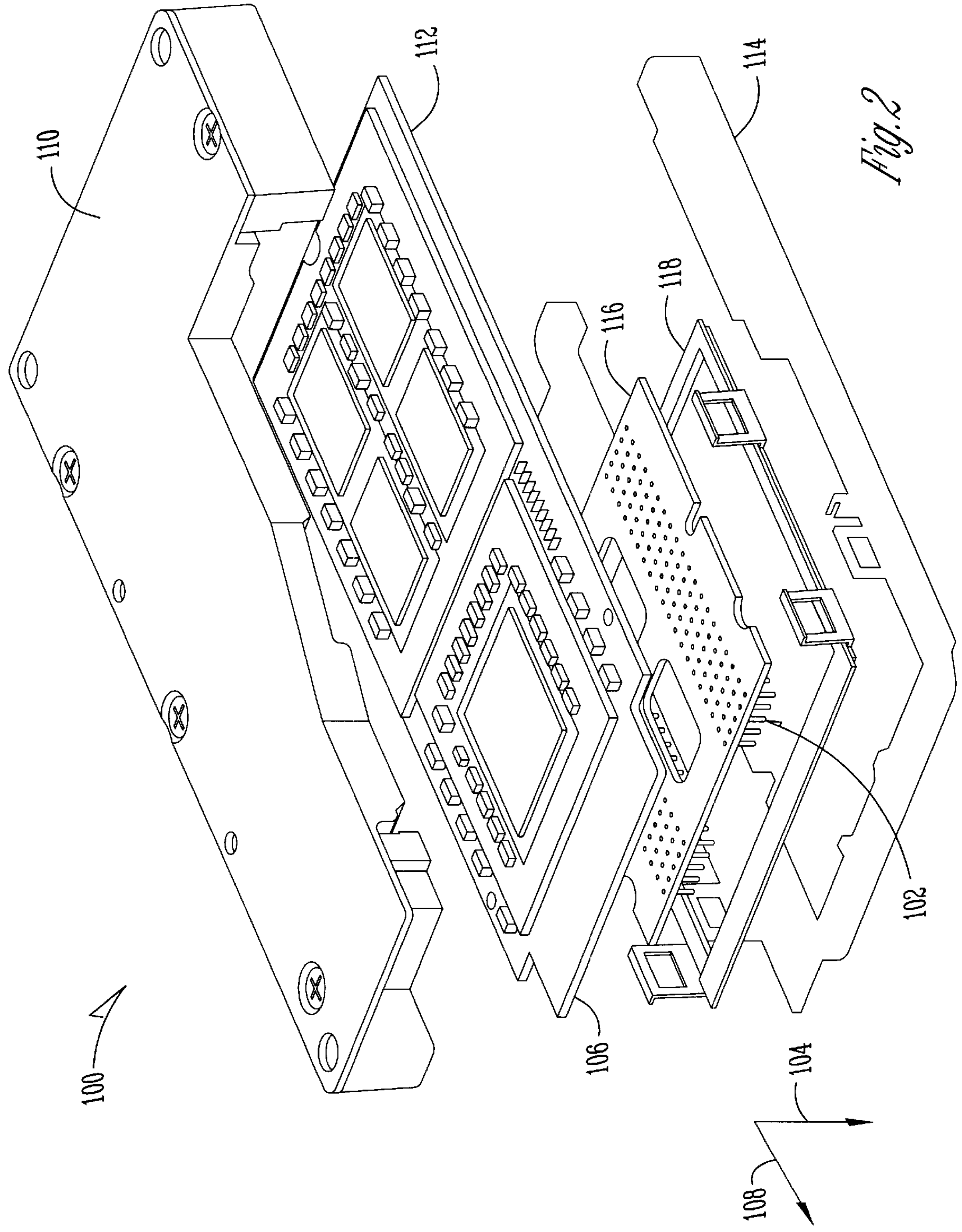
FIG. 2 is an exploded, perspective view of an example of a central processing unit (CPU) package or cartridge with signal pins extending in one direction and a power tab extending in another direction for use with the connector assembly of the present invention.

FIG. 2 is an exploded, perspective view of an example of an IC or CPU cartridge 100 or package, such as the Itanium™ CPU cartridge, for use with the connector assembly 10 of the present invention. The CPU cartridge 100 has a pin grid or array 102 extending in one direction or axis 104 and a power tab 106 extending in another direction or axis 108 substantially orthogonal to the one axis 104. The cartridge 100 includes a housing 110 that fits over a CPU printed circuit board 112 and attaches to a retaining member 114. The pin array 102 may be formed on a separate circuit board 116 that is connected to the CPU board 112 by a retainer arrangement 118.

Figure 3:
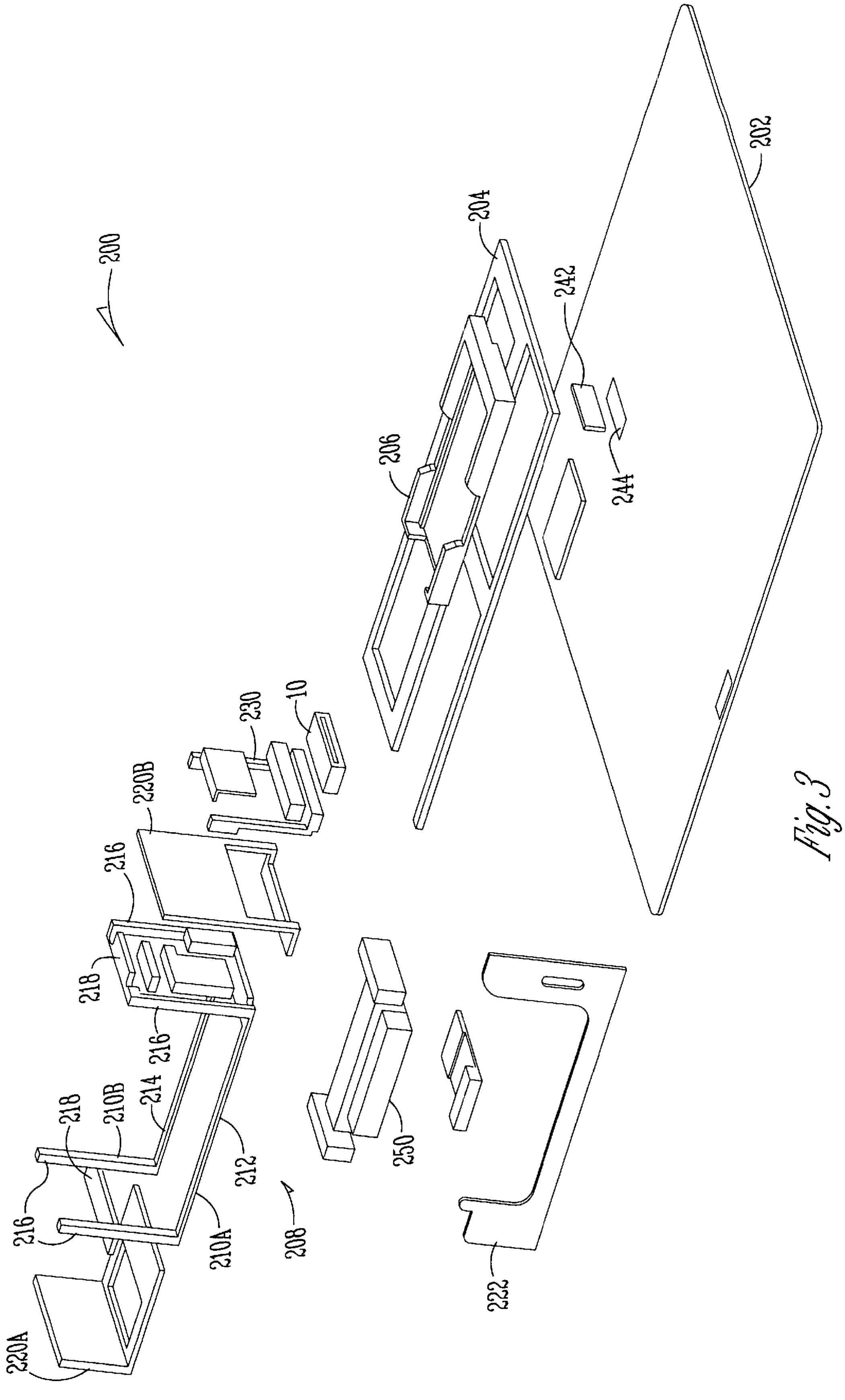
FIG. 3 is an exploded, perspective view of a system for testing an IC or CPU utilizing the connector assembly of the present invention.

Referring to FIG. 3, at least a portion of a system 200 for testing a CPU cartridge 100 is shown. The system 200 includes a printed circuit board or motherboard 202. A component mounting structure 204 is attached to the motherboard 202 and a socket 206 to receive the signal pins 102 of the CPU cartridge 100 is mounted to the mounting structure 204. In accordance with the present invention, the system 200 includes a floating and self-aligning suspension system 208. The floating and self-aligning suspension system 208 includes an inner frame 210. The inner frame 210 includes a first base member 212 and a second base member 214. A stanchion member 216 extends from an end of each of the first and second base members 212 and 214 substantially perpendicular to the base members 212 and 214. The stanchion members 216 may be integrally formed with the base members 212 and 214 to form two substantially U-shaped structures 210A and 210B. Each of the U-shaped structures 210A and 210B may be interconnected by cross-members 218. The suspension system 208 also includes an outer frame 220. The outer frame 220 includes a first plate 220A and a second plate 220B. A side guard 222 is attached to the first and second plates 220A and 220B on each side of the outer frame 220 (only one side guard 222 is shown in FIG. 2).

Figure 4:
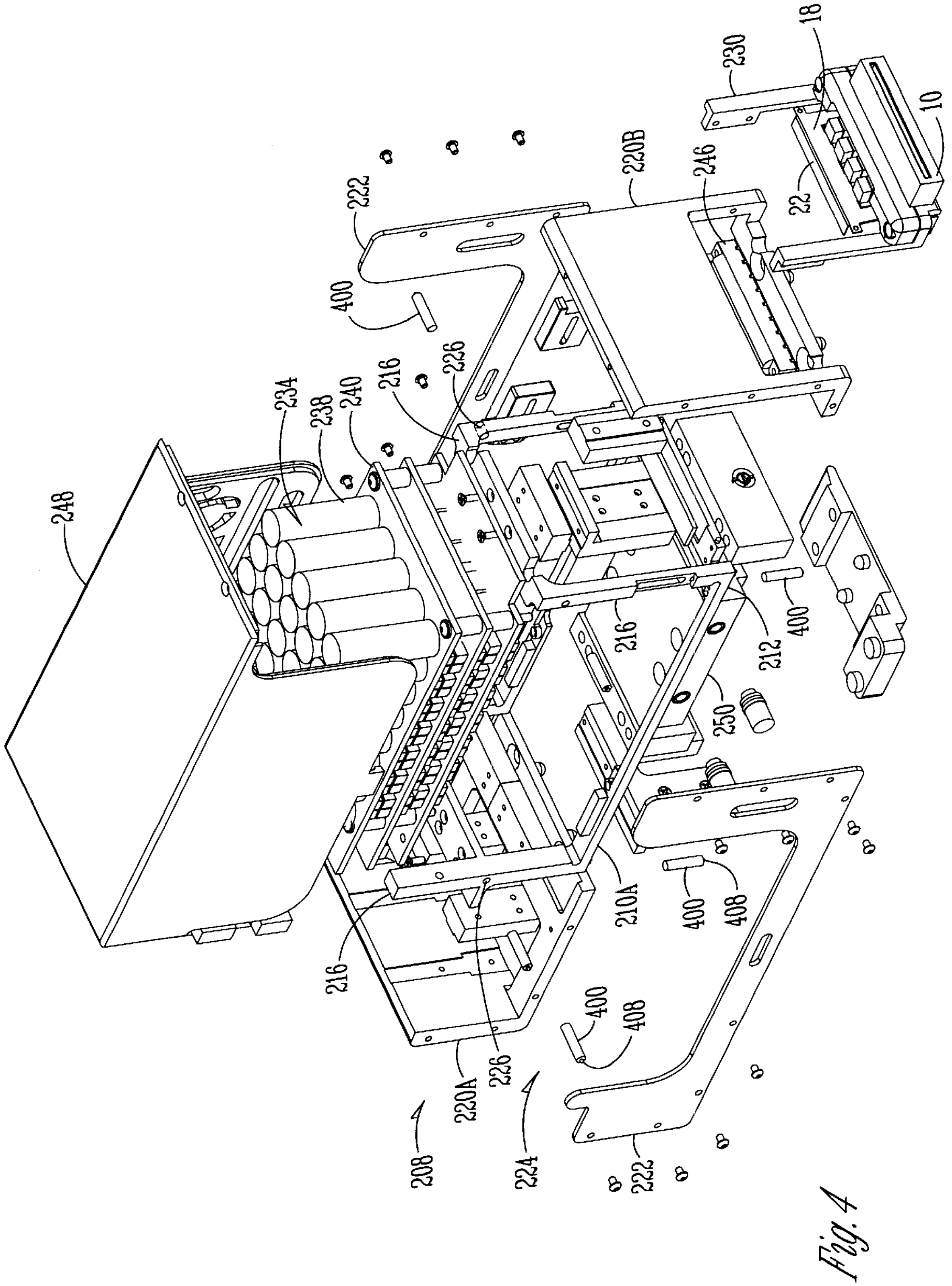
FIG. 4 is a detailed, exploded view of a floating and self-aligning suspension system and capacitor bank for use with the connector assembly of the present invention.

Referring also to FIG. 4 which is a detailed exploded view of the suspension system 208, a biasing arrangement 224 or mechanism is mounted to the inner frame 210 and contacts the outer frame 220 to allow the inner frame 210 to float or move independently in multiple different directions relative to the outer frame 220. The biasing arrangement 224 may include a plurality of plunger assemblies or mechanisms 400 or similar devices that permit the inner frame 210 to float within the outer frame 220. The plunger assemblies 400 are described in detail in U.S. patent application Ser. No. 09/858,223, filed May 15, 2001, now pending, and entitled "Floating and Self-Aligning Suspension System to Automatically Align and Attach a Connector to an Assembly" by Nader Abazarnia et al. (Attorney Docket No. 884.391US1). The plunger assemblies 400 may be mounted proximate to each end of the first and second base members 212 and 214 with each plunger 408 extending outwardly from the inner frame 210 or in a direction substantially opposite to the stanchion members 216 to contact the outer frame 220. Plunger assemblies 400 may also be mounted on each of the stanchions 216 extending outwardly from the inner frame 210 to contact the outer frame plates 220A and 220B. Accordingly, when the inner frame 210 is inserted within the outer frame 220, the inner frame may move independently along at least two axes of motion relative to the outer frame 220.

Figure 5:
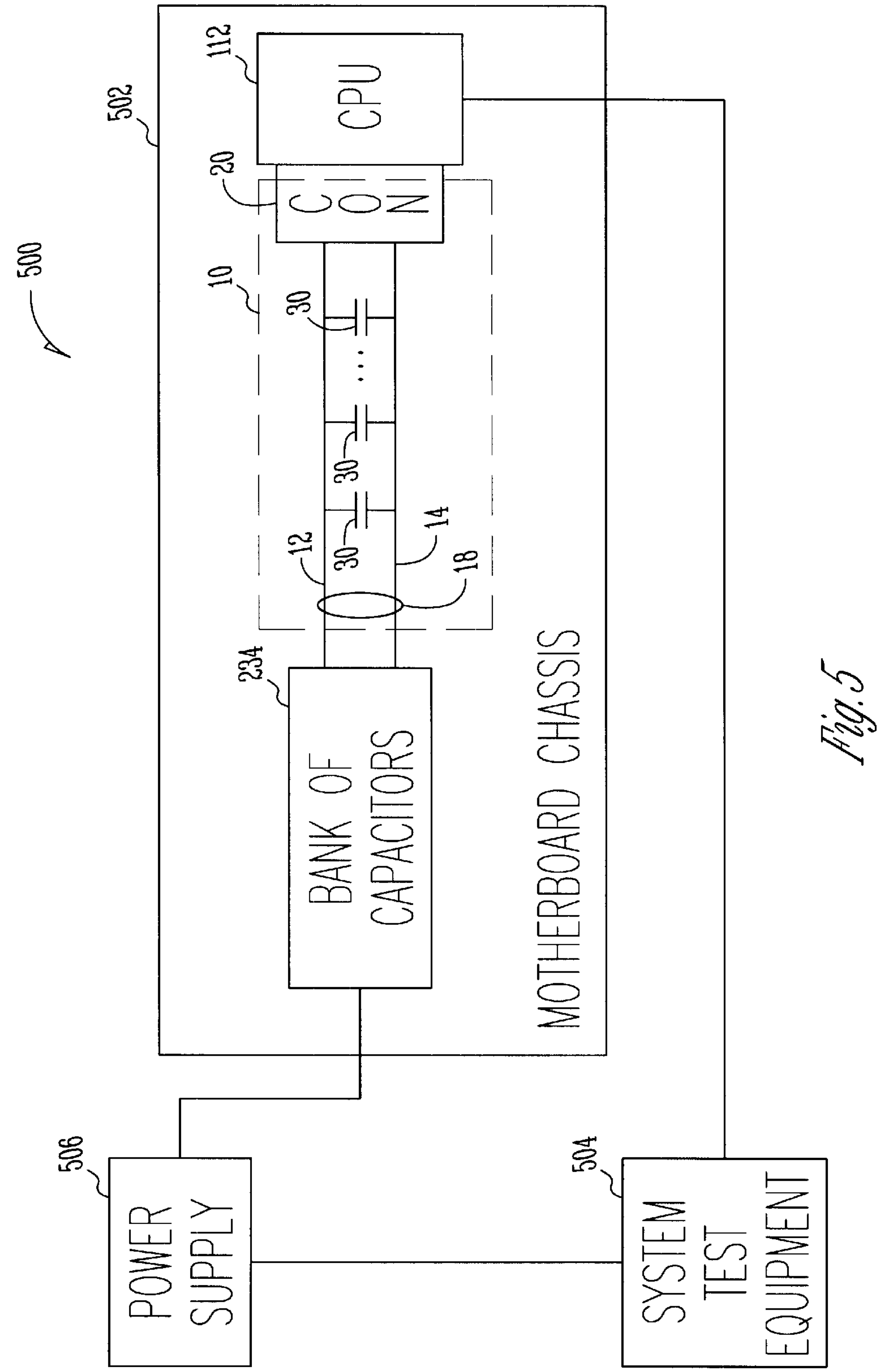
FIG. 5 is a block schematic diagram of a system for testing an IC or CPU in accordance with the present invention.

The connector assembly 10 is mounted to a bracket 230 and the bracket 230 is mounted to the inner frame 210. The tabs 22 and 24 (FIGS. 1A–1B) of the first and second conductive layers 12 and 14 forming the flex cable 18 are connected across a bank of capacitors 234 or "cap farm." Each of the capacitors 238 of the bank of capacitors 234 are mounted to a multiple level platform 240 and the platform 240 is attached to the inner frame 210. The bank of capacitors 234 are connected at another end by another portion of the flex cable 18 to a power contact 242 and a ground contact 244 on the motherboard 202 (FIG. 3). A compression contact 246 connects the other portion of the flex cable 232 to the power and ground contacts 242 and 244. As will be described in more detail below, the motherboard 202 may be connected to an external voltage or power supply 506 (FIG. 5). The capacitors 238 are connected in parallel between the external power supply 606 and the CPU 112 or IC to condition the voltage or power to provide the large current transient (di/dt) required by some high power CPUs 112, such as the Itanium™ CPU as manufactured by Intel. The flex cable 232 and the bank of capacitors 234 should be capable of carrying at least 100 amperes of current. A cap farm cover assembly 248 may be positioned over the bank of capacitors 234 to protect the capacitors 238 from damage.

FIG. 5 is a block schematic diagram of an example of a system 500 for testing the CPU 112 or similar device that utilizes the connector assembly 10 of the present invention. The system 500 includes a motherboard chassis 502 in which the motherboard 202 is contained. The chassis 502 is connected to a tester or system test equipment 504. The motherboard chassis 502 provides the signal connections to the CPU 112 for testing and evaluation of the CPU 112. The system test equipment 504 is also connected to the external power supply 506 to control operation of the power supply 506 which is also connected to the bank of capacitors 234 for conditioning the power applied to the CPU 112. The bank of capacitors 234 are connected to one end of the flexible cable 18 that includes the first and second flexible conductive layers 12 and 14 and the plurality of capacitors 30 are connected in parallel between the first and second conductive layers 12 and 14. The other end of the flexible cable 18 is attached to the connector 20 which attaches to the power tab 106 (FIG. 2) of the CPU 112. The system test equipment 504 tests the CPU 112 by booting up various operation systems and running actual software applications.

Figure 6:
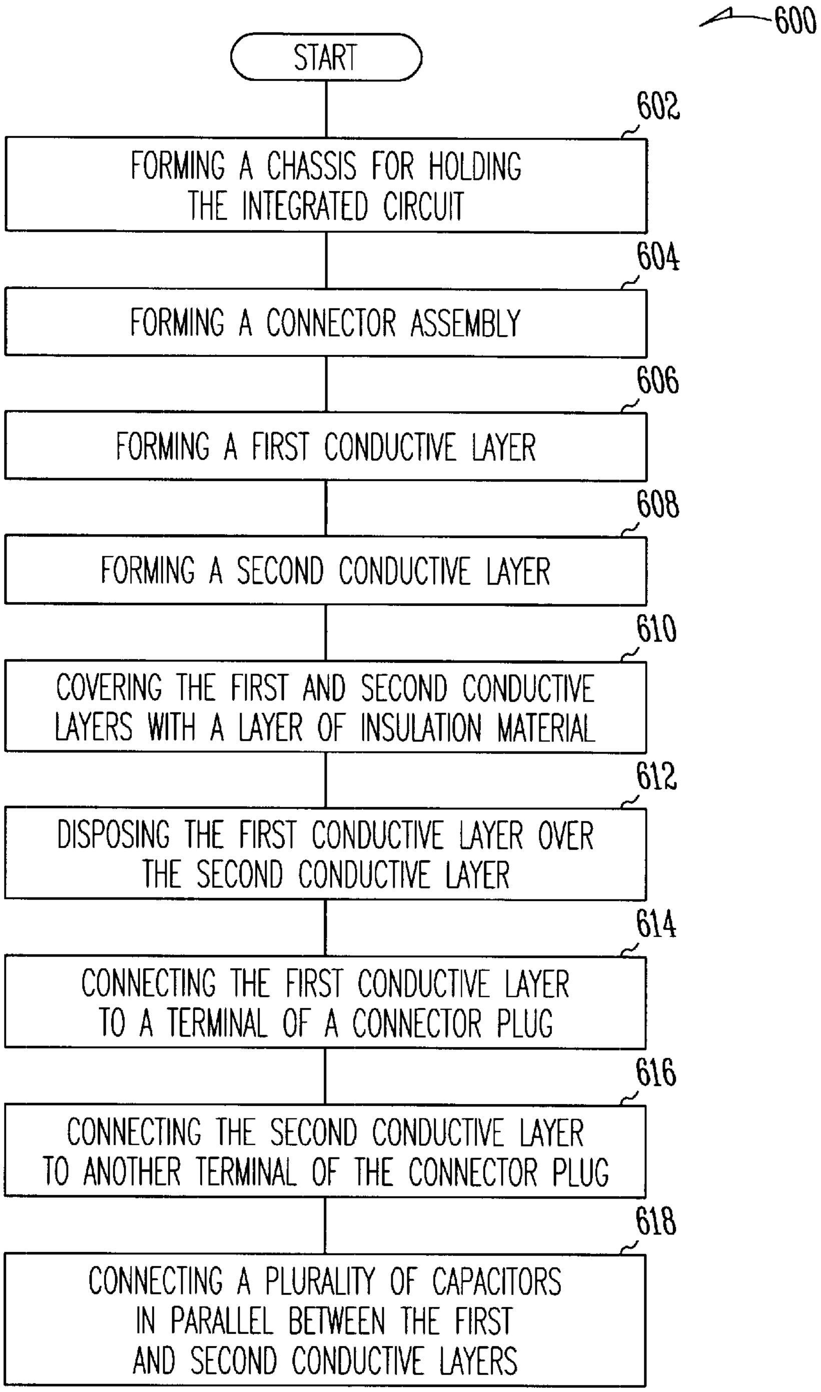
FIG. 6 is flow chart of a method for making a test system for an IC or CPU with the connector assembly of the present invention.

FIG. 6 is a flow graph of a method 600 for making the test system 500 for an IC or CPU 112 including the connector assembly 10 of the present invention. In block 602 a chassis, such as the motherboard chassis 502 is formed for holding the CPU 112. In block 604 the connector assembly 10 is formed. The process for manufacturing the connector assembly 10 was previously described with reference to FIGS. 1A–1C and is briefly repeated for completeness. In block 606 the first conductive layer 12 is formed and in block 608 the second conductive layer 14 is formed. The first and second conductive layers 12 and 14 are coated with a layer of insulation material 16 in block 610. In block 612, the first conductive layer 12 is disposed over the second conductive layer 14 to form the flexible cable 18. The first and second conductive layers 12 and 14 are connected at one end to the connector plug 20 in blocks 614 and 616. In block 618 the plurality of capacitors 30 are connected in parallel between the first and second conductive layers 12 and 14 which is described in detail with reference to FIGS. 1A–1C above. The number and size of capacitors 30 are selected to provide the desired reduction in ESR, voltage droop and settling time. It should be noted that there is no specific order to the blocks in FIG. 6 unless it logically follows that one task must be performed before a subsequent task.

Figure 7:
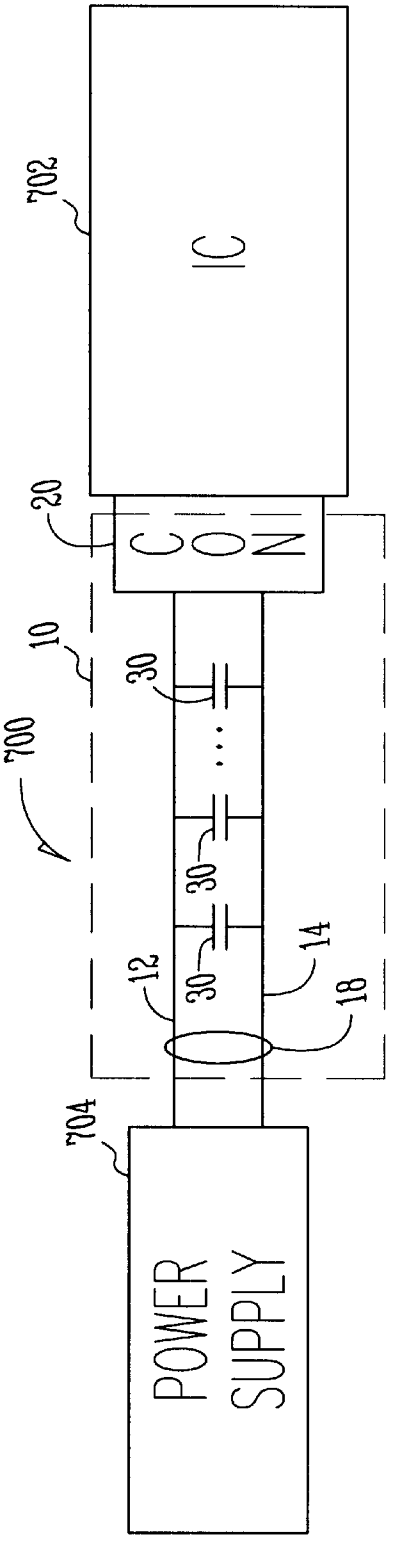
FIG. 7 is block schematic diagram of an electronic system incorporating the connector assembly of the present invention.

While the connector assembly 10 of the present invention has been described with respect to use in a system 500 for testing ICs or CPUs 112, the connector assembly 10 may be used in any application or system where ESR, voltage droop or settling time needs to be improved for proper operation of an IC associated with the connector assembly 10. FIG. 7 is an example of a system 700 incorporating the connector assembly 10. The system 700 includes at least one IC 702 that is powered by a power supply 704. The power supply 704 is connected to the IC 702 by the connector assembly 10. As described above, the number and size of the capacitors 30 are selected to provide the desired or required ESR, voltage droop and settling time reduction for proper and efficient operation of the IC 702.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is intended that this invention be limited only by the claims and the equivalents thereof.

What is claimed is:

1. A connector assembly, comprising:

a connector;

a cable receiver operable to attach a cable to the connector, the cable including:

a first conductive layer, a second conductive layer disposed substantially coplanar to the first conductive layer, and a layer of insulation material disposed at least between the first conductive layer and the second conductive layer; and a plurality of capacitors within the connector assembly, configured such that when the cable is attached the capacitors are electrically connected between the first conductive layer and the second conductive layer of the attached cable.

2. The connector assembly of claim 1, wherein the first conductive layer and the layer of insulation material are formed in a predetermined pattern.

3. The connector assembly of claim 1, wherein the cable is flexible.

4. The connector assembly of claim 1, wherein the layer of insulation material is a coating of mylar material substantially completely covering the first and second conductive layers.

5. The connector assembly of claim 1, wherein the capacitors are located to minimize voltage droop between the capacitors and an IC when the connector is attached to the IC.

6. The connector assembly of claim 1, wherein a quantity of the plurality of capacitors and a size of each of the plurality of capacitors are selected to provide a predetermined reduction in equivalent series resistance.

7. A system for testing an integrated circuit, comprising:

a chassis for holding the integrated circuit;

a connector assembly operable to connect a power supply to the integrated circuit;

a cable receiver operable to attach a cable to the connector, the cable including:

a first conductive layer, a second conductive layer disposed substantially coplanar to the first conductive layer, and a layer of insulation material disposed at least between the first conductive layer and the second conductive layer; and a plurality of capacitors within the connector assembly, configured such that when the cable is attached the capacitors are electrically connected between the first conductive layer and the second conductive layer o the attached cable.

8. The system of claim 7, wherein the cable is flexible.

9. The system of claim 8, further comprising a floating and self-aligning suspension system to which the connector is a ached.

10. The system of claim 9, wherein the floating and self-aligning suspension system comprises:

an outer frame;

an inner frame disposed within the outer frame, the connector being mounted to the inner frame; and a biasing mechanism attached to the inner frame.

11. The system of claim 7, wherein a quantity of the plurality of capacitors and a size of each of the plurality of capacitors are selected to provide a predetermined reduction in equivalent series resistance, voltage droop and settling time.

12. The system assembly of claim 7, wherein the first conductive layer and the layer of insulation material are formed in a predetermined pattern.

13. The system in claim 7, wherein the capacitors are located to minimize voltage droop between the capacitors and the IC when the connector is attached to the IC.

14. A electronic system, comprising:

at least one integrated circuit;

a connector to connect the integrated circuit to a power supply;

a cable receiver operable to attach a cable to the connector, the cable including:

a first conductive layer, a second conductive layer disposed substantially coplanar to the first conductive layer, and a layer of insulation material disposed at least between the first conductive layer and the second conductive layer; and a plurality of capacitors within the connector assembly, configured such that when the cable is attached the capacitors are electrically connected between the first conductive layer and the second conductive layer o the attached cable.

15. The system of claim 14, wherein the first conductive layer, the second conductive layer and the layer of insulation material are flexible.

16. The system of claim 14, wherein the first conductive layer and the layer of insulation material are formed in predetermined pattern for connection of each of the plurality of capacitors in parallel between t e first conductive layer and the second conductive layer.

17. The system of claim 14, wherein a quantity of the plurality of capacitors and a size of each of the plurality of capacitors are selected to provide a predetermined reduction in equivalent series resistance, voltage droop and settling time.

18. The system in claim 14, wherein the capacitors are located to minimize voltage droop between the capacitors and an IC when the connector is attached to the IC.

* * * * *

UNITED STATES PATENT AND TRADEMARK OFFICE

CERTIFICATE OF CORRECTION

PATENT NO. : 6,621,287 B2

DATED : September 16, 2003

INVENTOR(S) : Nader N. Abazarnia, Jeffrey H. Luke and James Neeb

It is certified that error appears in the above-identified patent and that said Letters Patent is hereby corrected as shown below:

Column 6,
Line 39, delete “o” and insert -- of -- therefor.
Line 43, delete “a ached” and insert -- attached -- therefor.

Column 7,
Line 10, delete “o” and insert -- of -- therefor.

Column 8,
Line 4, delete “t e” and insert -- the -- therefor.

Signed and Sealed this

Thirtieth Day of December, 2003

JAMES E. ROGAN
*Director of the United States Patent and Trademark Office*